United States Patent
Chang et al.

(10) Patent No.: US 10,177,894 B2
(45) Date of Patent: Jan. 8, 2019

(54) METHOD AND APPARATUS FOR TUNING FINITE IMPULSE RESPONSE FILTER IN IN-BAND FULL DUPLEX TRANSCEIVER

(71) Applicant: ELECTRONICS AND TELECOMMUNICATIONS RESEARCH INSTITUTE, Daejeon (KR)

(72) Inventors: Kapseok Chang, Daejeon (KR); Hyung Sik Ju, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 305 days.

(21) Appl. No.: 15/187,927

(22) Filed: Jun. 21, 2016

(65) Prior Publication Data

US 2016/0380799 A1    Dec. 29, 2016

(30) Foreign Application Priority Data

Jun. 25, 2015  (KR) .................. 10-2015-0090785
Jun. 25, 2015  (KR) .................. 10-2015-0090787
Jun. 25, 2015  (KR) .................. 10-2015-0090790
Jun. 25, 2015  (KR) .................. 10-2015-0090791
Jun. 14, 2016  (KR) .................. 10-2016-0074062
Jun. 14, 2016  (KR) .................. 10-2016-0074064
Jun. 14, 2016  (KR) .................. 10-2016-0074065
Jun. 14, 2016  (KR) .................. 10-2016-0074066

(51) Int. Cl.
*H04B 1/12*         (2006.01)
*H04L 5/14*         (2006.01)
*H04B 1/525*        (2015.01)
*H04J 11/00*        (2006.01)
*H04L 27/26*        (2006.01)
*H04L 25/03*        (2006.01)
*H03H 15/00*        (2006.01)

(52) U.S. Cl.
CPC ............... *H04L 5/14* (2013.01); *H04B 1/123* (2013.01); *H04B 1/525* (2013.01); *H04J 11/004* (2013.01); *H03H 15/023* (2013.01); *H03H 2015/007* (2013.01); *H04L 27/265* (2013.01); *H04L 2025/03815* (2013.01)

(58) Field of Classification Search
CPC ..................... H04L 5/14; H04L 27/265; H04L 2025/03815; H04B 1/123; H04B 1/525; H04J 11/004; H03H 2015/007; H03H 15/023
See application file for complete search history.

(56) References Cited

U.S. PATENT DOCUMENTS 5,886,986 A    3/1999    Lee et al.
8,606,175 B2   12/2013   Kwak et al.
(Continued)

*Primary Examiner* — Dady Chery
(74) *Attorney, Agent, or Firm* — LRK Patent Law Firm

(57) ABSTRACT

A method and an apparatus for tuning an FIR filter in an in-band full duplex transceiver. The method for tuning an FIR filter may include: setting attenuation of the FIR filter to be a first value and then estimating input information of the FIR filter; estimating a delta response using the estimated input information of the FIR filter; and updating the attenuation of the FIR filter to a second value using the estimated delta response.

17 Claims, 7 Drawing Sheets

(56) References Cited

U.S. PATENT DOCUMENTS

2008/0181421 A1\* 7/2008 Inoue ................... H04M 9/082
 381/66
2013/0301487 A1\* 11/2013 Khandani ............. H04W 16/14
 370/278

\* cited by examiner

METHOD AND APPARATUS FOR TUNING FINITE IMPULSE RESPONSE FILTER IN IN-BAND FULL DUPLEX TRANSCEIVER

CROSS-REFERENCE TO RELATED APPLICATIONS

This application claims priority to and the benefit of Korean Patent Application Nos. 10-2015-0090790, 10-2015-0090791, 10-2015-0090785, 10-2015-0090787, 10-2016-0074062, 10-2016-0074064, 10-2016-0074066 and 10-2016-0074065, filed in the Korean Intellectual Property Office on Jun. 25, 2015, Jun. 25, 2015, Jun. 25, 2015, Jun. 25, 2015, Jun. 14, 2016, Jun. 14, 2016, Jun. 14, 2016 and Jun. 14, 2016, respectively, the entire contents of which are incorporated herein by reference.

BACKGROUND OF THE INVENTION

1. Field of the Invention

The present invention relates to a method and an apparatus for tuning a finite impulse response (FIR) filter in an in-band full duplex transceiver.

2. Description of the Related Art

Today, most of the wireless communication systems have adopted a half duplex type. The half duplex type divides time or frequency to perform transmission or reception, thereby maintaining orthogonality between the transmission and reception. However, the half duplex type wastes resources (time or frequency).

An in-band full duplex (IFD) type has been suggested as a solution for solving inefficiency of the half duplex type. The in-band full duplex type is a technology of simultaneously performing transmission and reception in an in-band. The in-band full duplex type may theoretically increase link capacity up to twice, and therefore is an indispensable technology for achieving 1000 times traffic capacity required in 5G mobile communication.

However, the in-band full duplex (IFD) type has a problem in that a self-transmitted signal is introduced into a receiver and therefore the self-transmitted signal is very stronger than a valid received signal, such that the self-transmitted signal acts as a self-interference signal. For self-interference cancellation (SIC), there is an antenna region SIC technology of physically significantly spacing a transmitting antenna and a receiving antenna apart from each other. A technology for reducing a self-interference level using the antenna region SIC technology and canceling self-interference remaining in a digital region is in a commercialization stage. However, the technology is hardly applied to a small apparatus due to a physical space between the transmitting and receiving antennas.

For applying the in-band full duplex (IFD) type to the small apparatus, a technology for canceling self-interference in an analog circuit region without the help of the physical space between the antennas is required. As the SIC technology of the analog circuit region, there are largely a passive SIC technology and an active SIC technology. The passive SIC technology may use a passive element to easily obtain an SIC gain. However, the SIC gain is limited. Meanwhile, the active SIC technology may use an adaptive analog finite impulse response (FIR) filter circuit to obtain the SIC technology gain higher than that of the passive SIC technology. In this case, there is a problem in that the existing active SIC technology may not continuously maintain the high SIC gain while being quickly adapted to a change in surrounding environment over a wideband.

SUMMARY OF THE INVENTION

The present invention has been made in an effort to provide a method and an apparatus for tuning a finite impulse response (FIR) filter having advantages of allowing an in-band full duplex transceiver to have a high SIC gain.

An exemplary embodiment of the present invention provides a method for tuning a finite impulse response (FIR) filter in an in-band full duplex transceiver, the FIR filter receiving a transmission signal to cancel a self-transmitted interference signal. The method includes: setting attenuation of the FIR filter to be a predetermined first value and then estimating input information of the FIR filter; estimating a delta response using the input information of the FIR filter; updating the attenuation to a second value using the delta response; and applying the second value to the FIR filter.

The delta response may correspond to a value obtained by subtracting a baseband equivalent time impulse response for the FIR filter set as the first value from a baseband equivalent time impulse response for a radio channel.

The updating may include: calculating a third value that is the attenuation of the FIR filter to be updated by using the delta response; and calculating the second value by adding the third value to the first value.

The estimating of the input information of the FIR filter may include: setting the attenuation to be the first value and then generating and transmitting a first training signal, in a first period; measuring a first signal that is a baseband equivalent signal for a signal obtained by subtracting an output signal of the FIR filter from the self-transmitted interference signal, in the first period; generating and transmitting a second training signal in a second period; measuring a second signal that is a baseband equivalent signal for the self-transmitted interference signal, in a second period; and estimating the input information of the FIR filter using the first signal and the second signal.

The estimating of the delta response may include estimating the delta response using the input information of the FIR filter and the first signal.

The estimating of the input information of the FIR filter may include: subtracting the first signal from the second signal to generate a third signal that is a baseband equivalent signal for the output signal of the FIR filter; and calculating the input information of the FIR filter using the third signal.

The measuring of the second signal may include suppressing the output signal of the FIR filter from being generated and then measuring the second signal.

The first training signal and the second training signal may be the same signal.

The input information of the FIR filter may include a linear component and a nonlinear component.

The first period and the second period may be included in a field for transmitting the first training signal and the second training signal in a time domain frame.

Another embodiment of the present invention provides an in-band full duplex transceiver. The in-band full duplex transceiver includes: a transmitter generating and transmitting a transmitted signal; a receiver converting a received signal into a baseband frequency signal and demodulating the converted signal; a finite impulse response (FIR) filter receiving the transmitted signal to cancel a self-transmitted interference signal; and an estimator estimating input information of the FIR filter by performing fast Fourier transform (FFT) on output information of an analog digital converter included in the receiver and setting attenuation of the FIR filter using the input information of the FIR filter.

The estimator may set the attenuation to be a first value and then estimate the input information of the FIR filter, estimate a delta frequency response using the input information of the FIR filter, update the attenuation to a second value using the delta frequency response, and apply the second value to the FIR filter.

The delta frequency response may correspond to a value obtained by subtracting a frequency response for the FIR filter set as the first value from a frequency response for a radio channel.

The transmitter may generate and transmit a first training signal in a first period and generate and transmit a second training signal in a second period, and the estimator may set the attenuation to be first value and then perform FFT on output information of the analog digital converter to acquire a first signal, in the first period and perform the FFT on baseband equivalent information for the self-transmitted interference signal to acquire a second signal, in the second period.

The estimator may subtract the first signal from the second signal to calculate a third signal and use the third signal to calculate the input information of the FIR filter.

The estimator may set the attenuation of the FIR filter in the second period to suppress an output signal of the FIR filter.

The in-band full duplex transceiver may further include: an antenna transmitting the transmitted signal to receive the received signal; and a distributor transmitting the transmitted signal to the antenna and transmitting the received signal to the receiver.

The first training signal and the second training signal may be the same signal.

Yet another embodiment of the present invention provides a method for tuning a finite impulse response (FIR) filter in an in-band full duplex transceiver, the in-band full duplex transceiver including a transmitter generating and transmitting a transmitted signal, a receiver converting a received signal into a baseband frequency signal, and the FIR filter receiving the transmitted signal to cancel a self-transmitted interference signal. The method includes: setting attenuation of the FIR filter to be a first value and then generating and transmitting a first training signal, in a first period; performing FFT on output information of an analog digital converter included in the receiver to acquire a first signal, in the first period; generating and transmitting a second training signal in a state in which an output signal of the FIR filter is suppressed, in a second period; performing FFT on output information of the analog digital converter to acquire a second signal, in the second period; estimating the input information of the FIR filter using the first signal and the second signal; estimating a delta frequency response using the input information of the FIR filter; updating the attenuation to a second value using the delta frequency response; and applying the second value to the FIR filter.

The delta frequency response may correspond to a value obtained by subtracting a frequency response for the FIR filter set as the first value from a frequency response for a radio channel.

According to an exemplary embodiment of the present invention, it is possible to obtain the high SIC gain while being quickly adapted to the change in surrounding environment over a wideband by estimating the input information of the FIR filter and setting the attenuation of the FIR filter using the estimated input information.

DETAILED DESCRIPTION OF THE EMBODIMENTS

Figure 1:
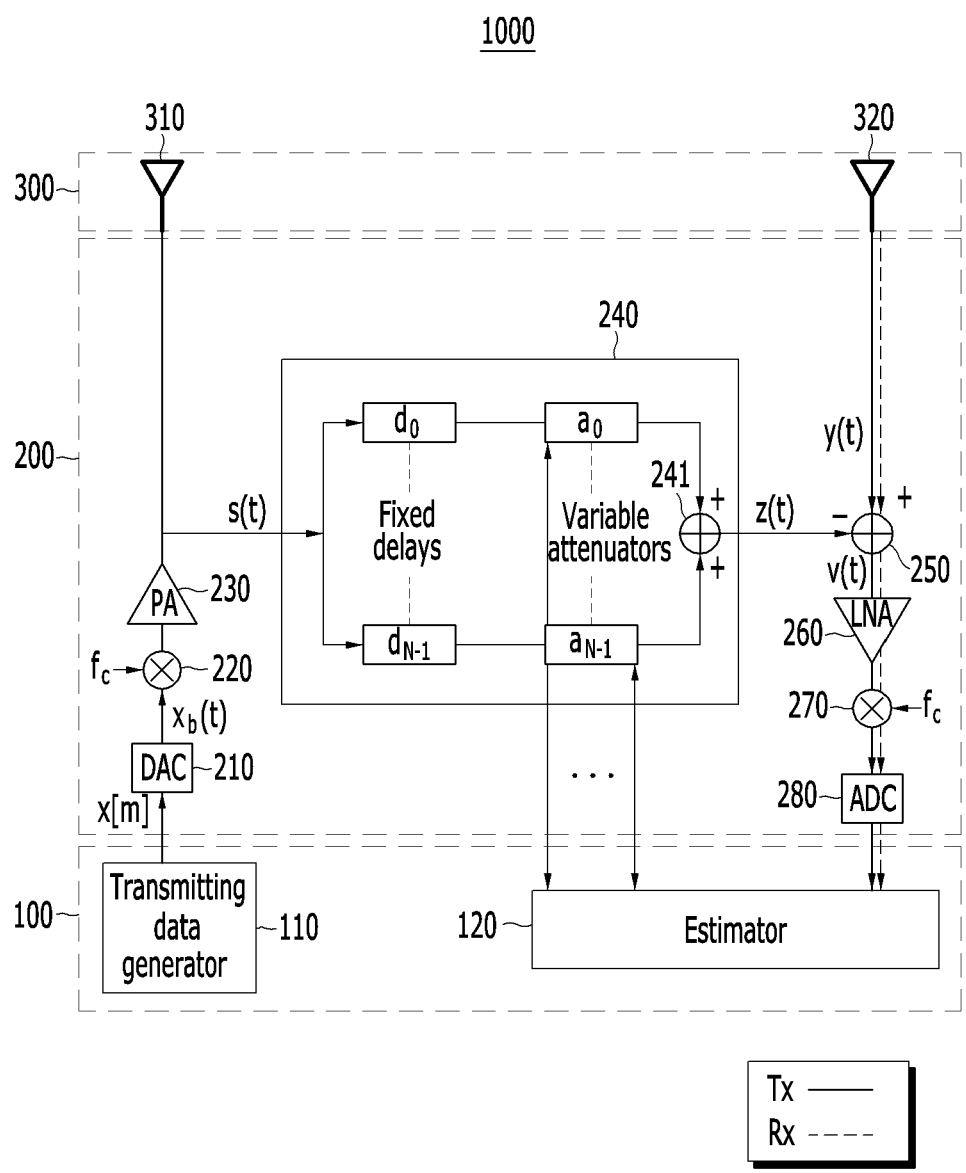
FIG. 1 is a diagram illustrating an in-band full duplex transceiver according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout the specification, a terminal may be called a mobile terminal (MT), a mobile station (MS), an advanced mobile station (AMS), a high reliability mobile station (HR-MS), a subscriber station (SS), a portable subscriber station (PSS), an access terminal (AT), user equipment (UE), and the like and may include functions of all or some of the MT, the MS, the AMS, the HR-MS, the SS, the PSS, the AT, the UE, and the like.

Further, a base station (BS) may be called an advanced base station (ABS), a high reliability base station (HR-BS), a nodeB, an evolved node B (eNodeB), an access point (AP), a radio access station (RAS), a base transceiver station (BTS), a mobile multihop relay (MMR)-BS, a relay station (RS) serving as a base station, a high reliability relay station (HR-RS) serving as a base station, and the like and may also include functions of all or some of the ABS, the HR-BS, the nodeB, the eNodeB, the AP, the RAS, the BTS, the MMR-BS, the RS, the HR-RS, and the like.

Throughout the specification, a transceiver may refer to a terminal, a mobile terminal (MT), a mobile station (MS), an advanced mobile station (AMS), a high reliability mobile station (HR-MS), a subscriber station (SS), a portable subscriber station (PSS), an access terminal (AT), user equipment (UE), and the like and may include functions of all or some of the terminal, the MT, the MS, the AMS, the HR-MS, the SS, the PSS, the AT, the UE, and the like.

Further, a transceiver may refer to a base station (BS), an advanced base station (ABS), a high reliability base station (HR-BS), a nodeB, an evolved node B (eNodeB), an access point (AP), a radio access station (RAS), a base transceiver station (BTS), a mobile multihop relay (MMR)-BS, a relay station (RS) serving as a base station, a high reliability relay station (HR-RS) serving as a base station, and the like and may also include functions of all or some of the Bs, the ABS, the HR-BS, the nodeB, the eNodeB, the AP, the RAS, the BTS, the MMR-BS, the RS, the HR-RS, and the like.

FIG. 1 is a diagram illustrating an in-band full duplex transceiver 1000 according to an exemplary embodiment of the present invention.

As illustrated in FIG. 1, the in-band full duplex transceiver 1000 according to the exemplary embodiment of the present invention includes a baseband digital region transmitting/receiving unit 100, an analog circuit region transmitting/receiving unit 200, and an antenna unit 300.

The baseband digital region transmitting/receiving unit 100 includes a transmitting data generator 110 and an estimator 120. Although not illustrated in FIG. 1, the baseband digital region transmitting/receiving unit 100 may further include a receiving data demodulation generator. The transmitting data generator 110 performs encoding and modulation to generate a digital signal corresponding to data to be transmitted. In FIG. 1, an output signal of the transmitting data generator 110, that is, a baseband time domain signal is represented by x[m]. A receiving data demodulation generator (not illustrated in FIG. 1) performs demodulation and decoding on receiving data. The estimator 120 sets attenuations for each tab of a finite impulse response (FIR) filter 240. An estimator 120 according to an exemplary embodiment of the present invention serves to estimate input information of the FIR filter 240 to set the attenuations for each tab of the FIR filter 240. Further, the estimator 120 according to the exemplary embodiment of the present invention may use the estimated input information of the FIR filter 240 to set the attenuations for each tab of the FIR filter 240, thereby canceling SIC.

The analog circuit region transmitting/receiving unit 200 includes a digital analog converter (DAC) 210, a mixer 220, a power amplifier (PA) 230, the FIR filter 240, a signal coupler 250, a low noise amplifier (LNA) 260, an integrator 270, and an analog digital converter (ADC) 280. The transmitting data generator 110, the DAC 210, the mixer 220, and the PA 230 form a transmitter. Further, the signal coupler 250, the LNA 260, the integrator 270, the ADC 280, and the receiving data demodulation generator form a receiver.

The DAC 210 converts a digital signal into an analog signal, the mixer 220 uses a carrier frequency $f_C$ to convert a baseband frequency signal into a radio frequency band signal. The PA 230 amplifies and outputs the RF band signal. In FIG. 1, an output signal of the DAC 210 is represented by $x_b(t)$ and an output signal of the PA 230, that is, a final transmitted signal is represented by s(t). The s(t) that is the final transmitted signal includes a nonlinear component (harmonics component and phase noise component) due to the mixer 220 and the PA 230. As described below, the estimator 120 according to the exemplary embodiment of the present invention estimates the baseband equivalent information for the s(t) including the nonlinear component.

The antenna unit 300 includes a transmitting antenna 310 and a receiving antenna 320. The transmitting antenna 310 transmits the transmitted signal s(t) to the outside and the receiving antenna 320 receives a received signal. The transmitting antenna 310 and the receiving antenna 320 physically approach each other, and therefore the transmitted signal s(t) is introduced through the receiving antenna 320 to act as an interference signal, in which the interference signal is a self-transmitted interference signal. The reason is that the transceiver 1000 according to the exemplary embodiment of the present invention is operated by an in-band full duplex type. The signal received through the receiving antenna 320 includes a self-transmitted interference signal as well as a normal received signal. In FIG. 1, the self-transmitted interference signal is represented by y(t). As described below, according to the exemplary embodiment of the present invention, the self-transmitted interference signal y(t) may be canceled using the FIR filter 240.

The FIR filter 240 receives the transmitted signal s(t) and generates and outputs a signal minimizing the self-transmitted interference signal y(t). As illustrated in FIG. 1, the FIR filter 240 according to the exemplary embodiment of the present invention includes a plurality of delayers $d_0$-$d_{N-1}$, a plurality of attenuators $a_0$-$a_{N-1}$, and a signal coupler 241.

The plurality of delayers $d_0$-$d_{N-1}$ each have a fixed delay. All delay intervals between the respective delayers $d_i$ (i=0, 1, . . . , N−1) may be the same or different and the delayers may be divided into a plurality of groups having the same delay interval. Here, N represents the total number of tabs and $d_i$ (i=0, 1, 2, . . . , N−1) represents a delay applied to the tab.

The plurality of attenuators $a_0$-$a_{N-1}$ are connected to the plurality of delayers $d_0$-$d_{N-1}$, respectively and attenuate signals. Attenuations of the respective attenuators $a_i$ (i=0, 1, 2 . . . , N−1) vary and are set by the estimator 120. Values of the attenuations of the respective attenuators $a_i$ (i=0, 1, 2 . . . , N−1) may have one of a size, a size and phase, a real value, and a complex value. For convenience, the following description will be made under the assumption that the attenuation has the size or the real value.

The signal coupler 241 couples output signals of the plurality of attenuators $a_0$-$a_{N-1}$. The signal coupler 241 adds and couples all the output signals of the plurality of attenuators $a_0$-$a_{N-1}$. In FIG. 1, the output signal of the signal coupler 241, that is, the output signal of the FIR filter 240 is represented by z(t).

The signal coupler 250 couples the received signal with the output signal of the FIR filter 240 and then outputs the coupled signal to the LNA 260. The signal coupler 250 subtracts the output signal of the FIR filter 240 from the received signal and then couples the two signals. In this case, the FIR filter 240 outputs the signal minimizing the self-transmitted interference signal y(t), and therefore the signal coupler 250 outputs a signal obtained by canceling the self-transmitted interference signal y(t) from the received signal to the LNA 260. In FIG. 1, the output signal of the signal coupler 250 is represented by v(t).

The LNA 260 receives the received signal from which the self-transmitted interference signal y(t) is canceled from the signal coupler 250 and cancels and amplifies noise from the received signal. The integrator 270 uses the carrier frequency $f_c$ to convert an RF band signal into a baseband frequency signal. The ADC 260 converts the baseband frequency signal that is an analog signal into the digital signal.

Figure 2:
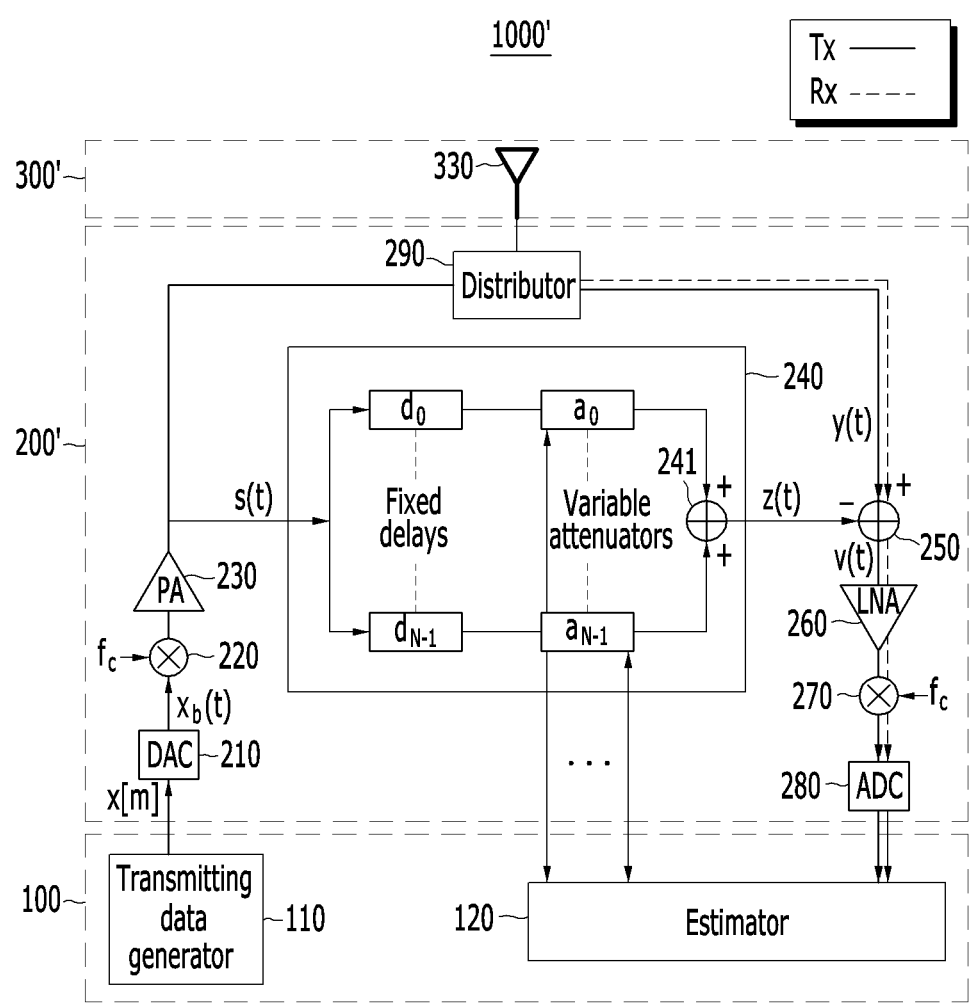
FIG. 2 is a diagram illustrating an in-band full duplex transceiver according to another exemplary embodiment of the present invention.

FIG. 2 is a diagram illustrating an in-band full duplex transceiver 1000' according to another exemplary embodiment of the present invention.

As illustrated in FIG. 2, the in-band full duplex transceiver 1000' according to another exemplary embodiment of the present invention includes the baseband digital region transmitting/receiving unit 100, an analog circuit region transmitting/receiving unit 200', and an antenna unit 300'. Except that the antenna unit 300' is configured of one transmitting/receiving antenna and the analog circuit region transmitting/receiving unit 200' further includes a distributor 290, the in-band full duplex transceiver 1000' is the same as FIG. 1, and therefore the description of the overlapping components with FIG. 1 will be omitted.

For the in-band full duplex type, the antenna unit 300' is configured of a transmitting/receiving antenna 330 that simultaneously performs a transmitter function and a receiver function. That is, through the antenna 330, the transmitted signal is transmitted and the received signal is received.

The analog circuit region transmitting/receiving unit 200' further includes the distributor 290. The distributor 290 is connected to the antenna 330 and transmits the transmitted signal s(t) to the antenna 330. Further, the distributor 290 transmits the received signal received from the antenna 330 to a receiving module (signal coupler 250, LNA 260, or the like of FIG. 1). That is, the distributor 290 according to the exemplary embodiment of the present invention serves to transmit the transmitted signal to the antenna 330 and transmit the received signal to the receiving module. The distributor 290 may be implemented as a circulator, an electrical balance duplexer (EBD), etc. The circulator and the EBD may be appreciated by a person having ordinary skill in the art to which the present invention pertains and thus the detailed description thereof will be omitted.

First, a method for processing, by an estimator 120, input information of an FIR filter 240 in a time domain to estimate the input information will be described. Input information z(t) of the FIR filter 240 includes a nonlinear component and the estimator 120 according to the exemplary embodiment of the present invention estimates the baseband equivalent information of s(t) including the nonlinear component. The method for estimating baseband equivalent information of z(t) described below will be described based on FIG. 2 but may also be equally applied to FIG. 1.

To describe the method for estimating, by an estimator 120, input information of an FIR filter 240, various signals of the in-band full duplex transceiver 1000' are mathematically modeled.

x[m] means a baseband time domain signal that is oversampled by d times. If d=1, x[m] means a time domain signal that is baseband-sampled. If the sampled signal passes through the DAC 210, a baseband analog signal $x_b(t)$ is generated by the following Equation 1.

$$x_b(t) = \Sigma x[m] \sin c(Wt-m) \quad \text{(Equation 1)}$$

In the above Equation 1, x[m] is $x_b$(m/W) and sin c(t) is defined by the following Equation 2.

$$\sinc(t) = \frac{\sin(\pi t)}{\pi t} \quad \text{(Equation 2)}$$

For the representation of the above Equation 1, a sampling theorem is applied. That is, the sampling theorem that all the baseband waveforms band-limited in W/2 may be represented by a linear combination of coefficients (i.e., x[m]) given by samples with an orthogonal basis $\{\sin c(Wt-m)\}_m$ is applied to the above Equation 1. In the above Equation 1, W may represent a bandwidth and may be a system bandwidth of the baseband and a bandwidth oversampled by d times. For convenience, the following description will be made under the assumption that the W is a bandwidth oversampled by one time (d=1), but a value of d may be set to be another value.

If $x_b$(t) passes through the mixer 220, it becomes the RF signal, and if the RF signal passes through the PA 230, it becomes the time domain input signal s(t) of the FIR filter 240. If the s(t) is mathematically represented, it becomes the following Equation 3.

$$s(t) = \sqrt{2P} \text{Re}\{\tilde{x}_b(t) e^{-j2\pi f_c t}\} \quad \text{(Equation 3)}$$

In the following Equation 3, $\tilde{x}_b(t)$ represents the baseband equivalent signal for the RF signal including the nonlinear component generated while the $x_b$(t) passes through the PA 230. P represents transmit power amplified by the PA 230 and $f_C$ represents the carrier frequency of the mixer 220. It may be appreciated based on the above Equation 3 that the s(t) includes both of the linear component and the nonlinear component. Hereinafter, a frequency domain expression for the s(t) in the above Equation 3 is defined by SM. In this case, f represents the RF frequency.

The RF signal s(t) in the above Equation 3 passes through the FIR filter 240 and the time domain expression of the passed RF signal becomes the following Equation 4.

$$z(t) = h_{fir}(t) * s(t) \quad \text{(Equation 4)}$$

In the above Equation 4, $h_{fir}$(t) represents a time impulse response for the RF region for the FIR filter 240. The baseband equivalent time impulse response for the $h_{fir}$(t) becomes the following Equation 5.

$$h_{fir}^b[l] = \sum_i a_i e^{-j2\pi f_c d_i} \sinc[l - d_i W] \quad \text{(Equation 5)}$$

In the above Equation 5, $d_i$ (i=0, 1, ..., N−1) and $a_i$ (i=0, 1, ..., N−1) each represent time delays and path attenuations for each tab of the FIR filter 240. Further, l represents an index of a filter tab. If the above Equation 5 is applied to a digital (baseband) region equivalent signal z[m] for z(t) that is an output of the FIR filter 240, the z[m] becomes the following Equation 6.

$$z[m] = \sum_l \tilde{x}[m-l] h_{fir}^b[l] \quad \text{(Equation 6)}$$

$$= \sum_l \tilde{x}[m-l] \sum_{i=0}^{N-1} a_i e^{-j2\pi f_c d_i} \sinc[l - d_i W],$$

$$m = 0, 1, \ldots, M-1$$

In the Equation 6, by the above Equation 3, $\tilde{x}[m] = \tilde{x}_b$(m/W), in which M represents a maxim sample number of a time domain.

Using the expression of the above Equations 4 to 6, the equivalent time domain expression y[m] in the digital (baseband) region for the self-transmitted interference signal y(t) becomes the following Equation 7.

$$y[m] = \sum_l \tilde{x}[m-l] h_{ch}^b[l] \quad \text{(Equation 7)}$$

$$= \sum_l \tilde{x}[m-l] \sum_{i=0}^{N'-1} b_i e^{-j2\pi f_c \tau_i} \sinc[l - \tau_i W],$$

$$m = 0, 1, \ldots, M-1$$

In the Equation 7, $h_{ch}^b[l]$ represents the baseband (digital region) equivalent time impulse response for the channel generated by characteristics of the distributor 290 and the antenna 330. Further, $b_i$ and $\tau_i$ each depend on the path attenuation and the time delay for each multipath i for the channel generated by the characteristics of the distributor 290 and the antenna 330. N' represents the total number of multipaths for the channel.

Figure 3:
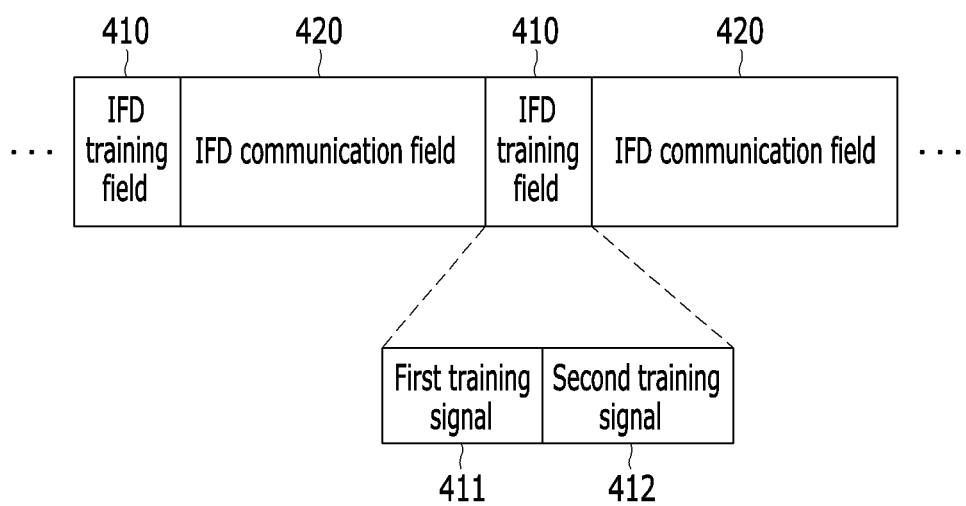
FIG. 3 is a diagram illustrating a time domain frame structure according an exemplary embodiment of the present invention.
Figure 4:
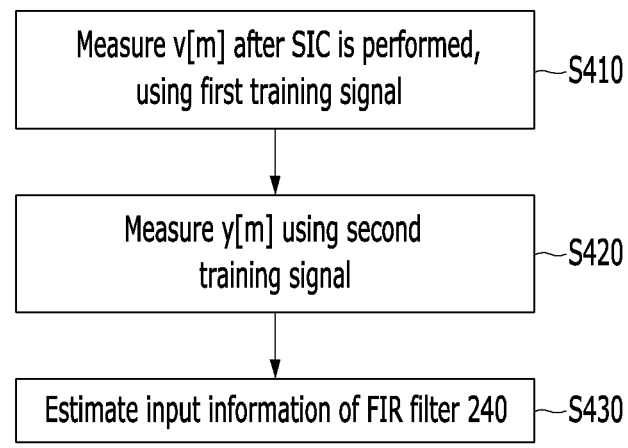
FIG. 4 is a flowchart illustrating a method for processing input information of an FIR filter in a time domain to estimate the input information according to an exemplary embodiment of the present invention.

Referring to FIGS. 3 and 4, the method for processing, by an estimator 120 according to the exemplary embodiment of the present invention, input information of an FIR filter 240 in a time domain to estimate the input information will be described. In the following description, it is assumed that in each expression of the above Equations 5 to 7, the LNA 260, the integrator 270, and the ADC 280 do not have hardware impairment.

FIG. 3 is a diagram illustrating a time domain frame structure according to an exemplary embodiment of the present invention.

As illustrated in FIG. 3, the time domain frame according to the exemplary embodiment of the present invention includes an in-band full duplex (IFD) training field 410 and an IFD communication field 420. The IFD training field 410 is a separate field for transmitting a training signal to estimate the input information of the FIR filter 240. In the IFD training field 410, a first training signal 411 and a second training signal 412 are transmitted. The first training signal 411 and the second training signal 412 are separately generated signals to estimate the input information of the FIR filter 240 and two signals may be allocated in the frequency domain and may also be allocated in the time domain. Further, the first training signal 411 and the second training signal 412 may each be transmitted over at least one orthogonal frequency division multiplexing (OFDM) symbol section. Meanwhile, the first training signal 411 and the second training signal 412 are the same signal. Further, the IFD communication field 420 is a section in which data for in-band full duplex transmission/reception are transmitted.

FIG. 4 is a flowchart illustrating a method for estimating input information of an FIR filter 240 according to an exemplary embodiment of the present invention.

First, the estimator 120 uses the first training signal 411 to measure v[m] after self-interference cancellation (SIC) is performed (S410). The estimator 120 sets the attenuation $a_i$ (i=0, 1, 2 ..., N–1) of the FIR filter 240 to be any initial set value (corresponding to a(u) of Equation 22). Further, the transmitting data generator 110 generates the first training signal 411 and the estimator 120 measures the output information v[m] of the signal coupler 250 for the first training signal 411. Here, v[m] is a signal measured using the output of the ADC 280 for the first training signal 411 and the estimator 120 receives the output of the ADC 280 to measure v[m]. Meanwhile, using the above Equations 6 and 7, the baseband equivalent signal v[m] for the output signal v(t) of the signal coupler 250 is as the following Equation 8.

$$v[m]=y[m]-z[m] \quad \text{(Equation 8)}$$

The estimator 120 uses the second training signal 412 to measure the baseband equivalent signal y[m] of the self-interference signal (S420). That is, the estimator 120 measures the above Equation 7 that is the baseband equivalent signal y[m] for the self-transmitted interference signal y(t).

For the estimator 120 to measure y[m], there is a need to introduce only the self-transmitted interference signal y(t) into the estimator 120. By a method for introducing a self-transmitted interference signal y(t) to an estimator 120, the estimator 120 may set the attenuation $a_i$ (i=0, 1, 2 ..., N–1) of the FIR filter 240 to be a very high value. By doing so, it is possible to physically suppress the output signal of the FIR filter 240 from being generated and only the self-transmitted interference signal y(t) is input to the estimator 120 through the LNA 260, the integrator 270, and the ADC 280. In this case, the estimator 120 measures the signal input from the ADC 280, in which the measured signal corresponds to the y[m].

Next, the estimator 120 estimates the input information of the FIR filter 240 (S430). If the above Equation 8 is subtracted from the above Equation 7, it becomes a baseband equivalent signal z[m] of an output signal z(t) of the FIR filter 240 represented like the above Equation 6. That is, the estimator 120 may estimate z[m] by subtracting the v[m] measured in step S410 from the y[m] measured in step S420. If a matrix expression for the above Equation 6 is obtained to estimate the input information of the FIR filter 240 from the z[m] estimated as described above, it becomes the following Equation 9.

$$z=A_{\tilde{x}} h_{fir} \quad \text{(Equation 9)}$$

In the above Equation 9, $A_{\tilde{x}}$ is a Toeplitz matrix of $\tilde{x}[m]$ and is represented by the following Equation 10.

$$A_{\tilde{x}} = \begin{bmatrix} \tilde{x}[-c] & \ldots & \tilde{x}[-1] & \tilde{x}[0] & \ldots & \tilde{x}[c-1] \\ \tilde{x}[1-c] & \ldots & \tilde{x}[0] & \tilde{x}[1] & \ldots & \tilde{x}[c] \\ \vdots & \vdots & \vdots & \vdots & \vdots & \vdots \\ \tilde{x}[M-1-c] & \ldots & \tilde{x}[M-2] & \tilde{x}[M-1] & \ldots & \tilde{x}[M+c-2] \end{bmatrix}$$

or $$A_{\tilde{x}} = \begin{bmatrix} \tilde{x}[c-1] & \ldots & \tilde{x}[1] & \tilde{x}[0] & \ldots & \tilde{x}[-c] \\ \tilde{x}[c] & \ldots & \tilde{x}[2] & \tilde{x}[1] & \ldots & \tilde{x}[1-c] \\ \vdots & \vdots & \vdots & \vdots & \vdots & \vdots \\ \tilde{x}[c+M-2] & \ldots & \tilde{x}[M] & \tilde{x}[M-1] & \ldots & \tilde{x}[M-c-1] \end{bmatrix}$$

(Equation 10)

In the above Equation 10, c represents the number of non-causal elements (i.e., samples).

In the above Equation 9, $h_{fir}$ is a vector expression for the above Equation 5 and is represented by the following Equation 11.

$$h_{fir} h_{fir}^b[-c] h_{fir}^b[-c+1] \ldots h_{fir}^b[0] h_{fir}^b[1] \ldots h_{fir}^b[c-1]]^T \text{ or}$$

$$h_{fir} h_{fir}^b[c-1] \ldots h_{fir}^b[1] h_{fir}^b[0] h_{fir}^b[-1] \ldots h_{fir}^b[-c]]^T \quad \text{(Equation 11)}$$

In the above Equation 11, symbol T represents a transpose of the vector. Time delay values $d_0$-$d_{N-1}$ and the attenuations $a_i$ (i=0, 1, 2 ..., N–1) for each tab of the FIR filter 240 as described in the step S410 are set to be any initial value, and therefore the baseband time impulse response vector represented by the above Equation 11 may be obtained by calculation. That is, the estimator 120 already knows the baseband time impulse response vector as represented by the above Equation 11.

By using a vector z of the Equation 9 estimated as described above and the previously acquired Equation 11, the baseband equivalent matrix for the input information of the FIR filter 240 is estimated by the following Equation 12.

$$\hat{A}_{\tilde{x}} = z h_{fir}^\dagger \text{ or } \hat{A}_{\tilde{x}} = z h_{fir}^H (h_{fir} h_{fir}^H)^{-1} \quad \text{(Equation 11)}$$

In the above Equation 12, $h_{fir}^\dagger$ represents a pseudo-inverse matrix of $h_{fir}$ and $h_{fir}^H$ represents the Hermitian of $h_{fir}$.

Finally, the estimator 120 extracts the x̃[m] that is the baseband equivalent component for the input signal of the FIR filter 240 in the matrix estimated by the above Equation 12. The x̃[m] extracted as described above is the baseband equivalent signal for the input signal of the FIR filter 240 to be obtained by the estimator 120. Further, as described above, the x̃[m] includes information on the nonlinear component as well as the information on the linear component.

Meanwhile, to minimize the self-interference signal using the x̃[m], the estimator 120 resets the attenuation $a_i$ (i=0, 1, 2 . . . , N−1) of the FIR filter 240. That is, the estimator 120 tunes the attenuation set as the initial value in the step S410 to be a value for minimizing the self-interference signal. Hereinafter, a method for tuning, by an estimator 120, an FIR filter 240 according to an exemplary embodiment of the present invention will be described with reference to FIG. 5.

Figure 5:
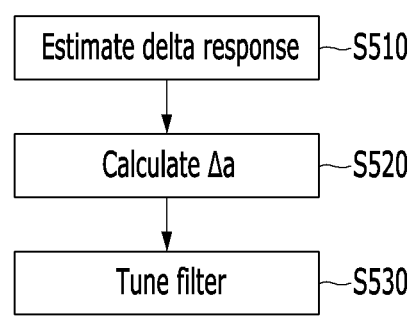
FIG. 5 is a flowchart illustrating a method for tuning, by an estimator, an FIR filter according to an exemplary embodiment of the present invention.

FIG. 5 is a flowchart illustrating a method for tuning, by an estimator 120, an FIR filter 240 according to an exemplary embodiment of the present invention.

First, the estimator 120 according to the exemplary embodiment of the present invention estimates a delta response (S510). The v[m] that is the above Equation 8 may be represented by the following Equation 13.

$$v[m] = y[m] - z[m] \qquad \text{(Equation 13)}$$
$$= \sum_l \tilde{x}[m-l](h_{ch}^b[l] - h_{fir}^b[l])$$
$$= \sum_l \tilde{x}[m-l]\Delta h_{fir}^b[l].$$

In the above Equation 13, $\Delta h_{fir}^b[l]$ becomes the delta response to be estimated by the estimator 120. $\Delta h_{fir}^b[l]$ becomes $h_{ch}^b[l] - h_{fir}^b[l]$. Referring to the above Equation 5, $h_{ch}^b[l] - h_{fir}^b[l]$ is represented by the following Equation 14. $\Delta h_{fir}^b[l] h_{ch}^b[l]$ represents the baseband equivalent time impulse response for a radio channel and $h_{fir}^b[l]$ is the same as the above Equation 5. $h_{ch}^b[l]$ $$\Delta h_{fir}^b[l] = \sum_i \Delta a_i e^{-j2\pi f_c d_i} \mathrm{sinc}[l - d_i W] \qquad \text{(Equation 14)}$$

In the above Equation 14, $\Delta a_i$ represents update attenuation of an i-th attenuator. If a matrix expression for the above Equation 13 is obtained, it becomes the following Equation 15.

$$v = A_{\tilde{x}} \Delta h_{fir} \qquad \text{(Equation 15)}$$

In the above Equation 15, is the same as the above Equation 10 and is a value already obtained in FIG. 4. That is, $A_{\tilde{x}}$ corresponds to the matrix estimated by the above Equation 12. In the above Equation 15, $\Delta h_{fir}$ represents the delta response vector added to the current baseband equivalent time impulse response to update the time impulse response characteristics of the FIR filter 240. $\Delta h_{fir}$ $\Delta h_{fir}$ is represented by the following Equation 16. $\Delta h_{fir}$ $$\Delta h_{fir} h_{fir}^b[-c]\Delta h_{fir}^b[-c+1] \ldots \Delta h_{fir}^b[0]\Delta h_{fir}^r[1] \ldots \Delta h_{fir}^b[c-1]]^T$$

or $$\Delta h_{fir} h_{fir}^b[-c]\Delta h_{fir}^b[-c+1] \ldots \Delta h_{fir}^b[0]\Delta h_{fir}^b[1] \ldots \Delta h_{fir}^b[c-1]]^T$$

$$\Delta h_{fir} h_{fir}^b[c-1] \ldots \Delta h_{fir}^b[1]\Delta h_{fir}^b[0]\Delta h_{fir}^b[-1] \ldots \Delta h_{fir}^b[-c]]^T \qquad \text{(Equation 16)}$$

In the above Equation 15, if a pseudo-inverse matrix for the $A_{\tilde{x}}$ is taken, the $\Delta h_{fir}$ is estimated by the following Equation 17.

$$\Delta \hat{h}_{fir} = A_{\tilde{x}}^\dagger v \qquad \text{(Equation 17)}$$

In the above Equation 17, $A_{\tilde{x}}^\dagger$ represents the pseudo-inverse matrix of $A_{\tilde{x}}$. The $A_{\tilde{x}}$ is a matrix already known by being estimated like the above Equation 12, and therefore $A_{\tilde{x}}^\dagger$ the may be obtained by calculation. $A_{\tilde{x}}$ Further, v is also a value already obtained by being measured based on the first training signal in the step S410. Therefore, the delta response $\Delta h_{fir}$ to be estimated is estimated by the above Equation 17.

Next, the estimator 120 according to the exemplary embodiment of the present invention calculates the attenuation $\Delta a$ to be updated (S520). To calculate the update attenuation $\Delta a$ of the FIR filter 240 from the delta response expression of the above Equation 14, the $\Delta a$ of the above Equation 17 may be represented by the following Equation 18.

$$\Delta \hat{h}_{fir} = s \Delta a \qquad \text{(Equation 18)}$$

In the above Equation 18, s is represented by the following Equation 19.

$$s = \begin{bmatrix} e^{-j2\pi f_c d_0} & \cdots & e^{-j2\pi f_c d_{N-1}} \\ \mathrm{sinc}(-c - d_0 W) & & \mathrm{sinc}(-c - d_{N-1} W) \\ \vdots & \vdots & \vdots \\ e^{-j2\pi f_c d_0} & & e^{-j2\pi f_c d_{N-1}} \\ \mathrm{sinc}(c-1 - d_0 W) & \cdots & \mathrm{sinc}(c-1 - d_{N-1} W) \end{bmatrix} \qquad \text{(Equation 19)}$$

or $$s = \begin{bmatrix} e^{-j2\pi f_c d_0} & \cdots & e^{-j2\pi f_c d_{N-1}} \\ \mathrm{sinc}(c-1 - d_0 W) & & \mathrm{sinc}(c-1 - d_{N-1} W) \\ \vdots & \vdots & \vdots \\ e^{-j2\pi f_c d_0} & & e^{-j2\pi f_c d_{N-1}} \\ \mathrm{sinc}(-c - d_0 W) & \cdots & \mathrm{sinc}(-c - d_{N-1} W) \end{bmatrix}$$

In the s like the above Equation 19, $f_c$ is the carrier frequency and is a value already known, $d_0$-$d_{N-1}$ are a fixed delay value and are a preset value, and W is a bandwidth and is a value already known. Therefore, the s may be obtained by the above Equation 19.

In the above Equation 18, the $\Delta a$ is represented by the following Equation 20.

$$\Delta a = [\Delta \hat{a}_0 \Delta \hat{a}_1 \ldots \Delta \hat{a}_{N-1}]^T \qquad \text{(Equation 20)}$$

In the above Equation 18, the $\Delta \hat{h}_{fir}$ is the vector obtained by the estimation in step S510 and s is also the value calculated by the above Equation 19, which is already known. Therefore, $\Delta a$ is obtained by the following Equation 21.

$$\Delta a = s^\dagger \Delta \hat{h}_{fir} \text{ or } \Delta = (s^H s)^{-1} s^H \Delta \hat{h}_{fir}$$

$$\Delta a = s^\dagger \Delta \hat{h}_{fir} \qquad \text{(Equation 21)}$$

Finally, the estimator 120 according to the exemplary embodiment of the present invention uses the $\Delta a$ to tune the attenuation of the FIR filter 240 (S530). By using the $\Delta a$ obtained by the above Equation 21, the estimator 120 determines attenuation a(u+1) to be updated by the following Equation 22.

$$a(u+1) = a(u) + \Delta a \qquad \text{(Equation 22)}$$

In the above Equation 22, a(u) represents the vector of the current attenuation and corresponds to any initial set value described in the step S410 of FIG. 4. Further, a(u+1) represents the vector of the attenuation to be finally updated.

The FIR filter 240 applies the attenuation a(u+1) to be updated determined by the above Equation 22 to the attenuator of the FIR filter 240. By doing so, the estimator 120 according to the exemplary embodiment of the present invention may minimize the self-interference signal.

According to the exemplary embodiment of the present invention as described above, the attenuation of the FIR filter 240 is set using the baseband equivalent signal for the input signal of the FIR filter 240 including the linear component and the nonlinear component, thereby obtaining the high SIC gain.

Next, a method for processing, by an estimator 120, input information of a FIR filter 240 in a frequency domain to estimate the input information will be described.

Referring to FIGS. 1 and 2, the RF signal like the above Equation 3 passes through the FIR filter 240 and a frequency domain expression for a transfer function of the FIR filter 240 is as the following Equation 23.

$$H_{fir}(f) = \sum_{q=0}^{N-1} a_q e^{-j2\pi f d_q} \quad \text{(Equation 23)}$$

In the above Equation 23, $d_q$ represents a time delay of a q-th tab and $a_q$ represents path attenuation of the q-th tab. By using the expressions of the above Equations 3 and 23, the frequency domain and time domain expressions for the output signal of the FIR filter 240 are as the following Equation 24.

$$Z(f) = H_{fir}(f)S(f) = \left(\sum_{q=0}^{N-1} \hat{a}_q e^{-j2\pi f d_q}\right) S(f), \quad \text{(Equation 24)}$$

$$z(t) = h_{fir}(t) * s(t)$$

By using the expressions of the above Equations 3 and 23, the self-transmitted interference signal y(t) and the frequency domain expression thereof are as the following Equation 25.

$$Y(f) = H_{ch}(f)S(f) = \left(\sum_{i=0}^{N'-1} b_i e^{-j2\pi f \tau_i}\right) S(f), \quad \text{(Equation 25)}$$

$$y(t) = h_{ch}(t) * s(t)$$

In the above Equation 25, $h_{ch}(t)$ represents the time impulse response to a channel generated by characteristics of the distributor 290 and the antenna 330 and $H_{Ch}(f)$ represents the frequency domain expression of the $h_{ch}(t)$. Further, $b_i$ and $\tau_i$ each depend on the path attenuation and the time delay for each multipath i for the channel generated by the characteristics of the distributor 290 and the antenna 330. N' represents the total number of multipaths for the channel.

By using the expressions of the Equations 24 and 25, the frequency domain expression for the output signal v(t) of the signal coupler 250 is as the following Equation 26.

$$V(f) = Y(f) - Z(f) \quad \text{(Equation 26)}$$
$$= H_{ch}(f)S(f) - H_{fir}(f)S(f)$$
$$= (H_{ch}(f) - H_{fir}(f))S(f).$$

Next, referring to FIG. 6, a method for processing, by the estimator 120 according to another exemplary embodiment of the present invention, the input information of the FIR filter 240 in the frequency domain to estimate the input information will be described. In the following description, it is assumed that in each expression of the above Equations 24 to 26, the LNA 260, the integrator 270, and the ADC 280 do not have hardware impairment.

Figure 6:
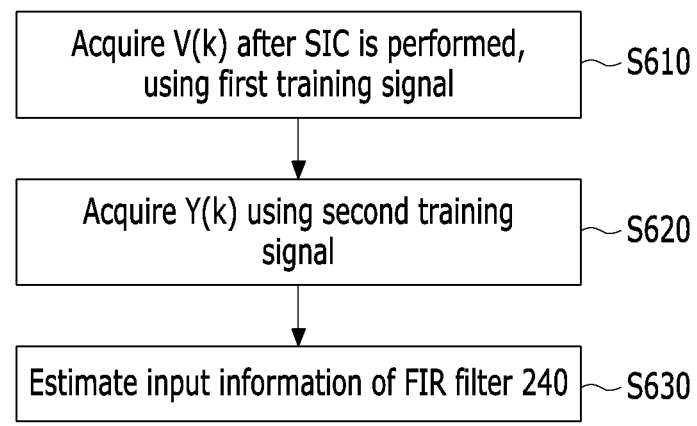
FIG. 6 is a flowchart illustrating a method for processing input information of an FIR filter in a frequency domain to estimate the input information according to another exemplary embodiment of the present invention.

FIG. 6 is a flowchart illustrating a method for processing input information of an FIR filter 240 in a frequency domain to estimate the input information according to another exemplary embodiment of the present invention.

First, the estimator 120 uses a first training signal 411 to obtain V[k] after the self-interference cancellation (SIC) is performed (S610). The estimator 120 sets the attenuation $a_i$ (i=0, 1, 2 . . . , N−1) of the FIR filter 240 to be any initial value. Further, the transmitting data generator 110 generates the first training signal 411 and the estimator 120 obtains the output information V(k) of the signal coupler 250 for the first training signal 411. Here, the V[k] is a signal obtained by performing fast Fourier transform (FFT) on the output of the ADC 280 due to the first training signal 411 and the estimator 120 acquires the V(k) by receiving the output of the ADC 280 and performing the FFT on the received output. That is, the V[k] is a value obtained by performing the FFT on a baseband version (equivalent) information (i.e., output information of the ADC 280) for the v(t). If the V(k) is mathematically represented, it becomes the following Equation 27.

$$V(k) = Y(k) - Z(k) \quad \text{(Equation 27)}$$
$$= H_{ch}(k)S(k) - H_{fir}(k)S(k)$$
$$= (H_{ch}(k) - H_{fir}(k))S(k),$$

$$k = 0, 1, 2, \ldots, F-1$$

In the above Equation 27, k represents a subscriber index and F represents a size of the FFT. The V(k) of the above Equation 27 may be a version that is baseband sampled for the above Equation 26. Meanwhile, in step S610, the attenuation $a_i$ (i=0, 1, 2 . . . , N−1) of the FIR filter 240 is set to be any value and the time delay $d_0$-$d_{N-1}$ is a fixed value, such that $H_{fir}(k)$ of the above Equation 27 may be calculated by the following Equation 28.

$$H_{fir}(k) = \sum_{q=0}^{N-1} a_q e^{-j\frac{2\pi f_s k d_q}{F}} \text{ or } H_{fir}(k) = \sum_{q=0}^{N-1} a_q e^{-j\frac{2\pi k d_q}{F}} \quad \text{(Equation 28)}$$

In the above Equation 28, $f_s$ represents a baseband sampling rate and $H_{fir}(k)$ may be a version that is baseband sampled for $H_{fir}(f)$ defined in the above Equation 23.

The estimator 120 uses the second training signal 412 to acquire Y(k) corresponding to the self-interference signal (S620). That is, the estimator 120 performs the FFT on the baseband version (equivalent) information (i.e., output information of the ADC 280) for the self-transmitted interference signal y(t) to acquire the Y(k) by the following Equation 29.

$$Y(k)H_{ch}(k)S(k) \qquad \text{(Equation 29)}$$

The Y(k) like the above Equation 29 may be a version that is baseband sampled for Y(f) defined in the above Equation 25.

For the estimator 120 to acquire the Y(k), there is a need to introduce only the self-transmitted interference signal y(t) into the estimator 120. By a method for introducing a self-transmitted interference signal y(t) to an estimator 120, the estimator 120 may set the attenuation $a_i$ (i=0, 1, 2 . . . , N−1) of the FIR filter 240 to be a very high value. By doing so, it is possible to physically suppress the output signal of the FIR filter 240 from being generated and only the self-transmitted interference signal y(t) is input to the estimator 120 through the LNA 260, the integrator 270, and the ADC 280. In this case, the estimator 120 performs the FFT on the signal input from the ADC 280 to acquire the Y(k).

Next, the estimator 120 estimates the input information of the FIR filter 240 (S630). If the above Equation 27 is subtracted from the above Equation 29, it becomes Z(k) by the following Equation 30. That is, the estimator 120 may calculate the Z(k) by subtracting the V(k) measured in the step S610 from the Y(k) measured in the step S620. The Z(k) calculated as described above is represented by the following Equation 30.

$$Y(k)(k)=Z(k)=H_{fir}(k)S(k) \qquad \text{(Equation 30)}$$

As described in the above Equation 28, the $H_{fir}(k)$ is a value already calculated, and therefore the estimator 120 may use the above Equation 30 to estimate S(k) that is the input information of the FIR filter 240. The S(k) corresponds to the baseband equivalent frequency domain input information of the FIR filter 240. The expression for the S(k) estimated as described above is as the following Equation 31.

$$\hat{S}(k) = \frac{Y(k) - V(k)}{H_{fir}(k)} \qquad \text{(Equation 31)}$$

When the estimator 120 performs inverse FFT (IFFT) on the above Equation 31, the baseband equivalent time domain input information of the FIR filter 240 may be acquired.

Meanwhile, the estimator 120 according to another exemplary embodiment of the present invention uses the S(k) estimated in FIG. 6 to minimize the self-interference signal, thereby resetting the attenuation $a_i$ (i=0, 1, 2 . . . , N−1) of the FIR filter 240. That is, the estimator 120 tunes the attenuation set as the initial value in the step S610 to be a value for minimizing the self-interference signal. Hereinafter, a method for tuning, by the estimator 120 according to another exemplary embodiment of the present invention, the FIR filter 240 will be described with reference to FIG. 7.

Figure 7:
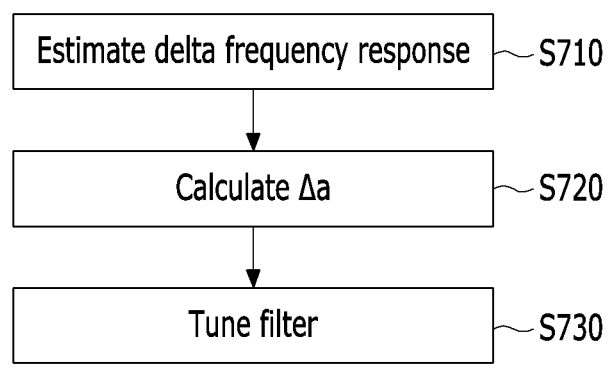
FIG. 7 is a flowchart illustrating a method for tuning, by an estimator, an FIR filter according to another exemplary embodiment of the present invention.

FIG. 7 is a flowchart illustrating a method for tuning, by an estimator 120, an FIR filter 240 according to another exemplary embodiment of the present invention.

First, the estimator 120 according to the exemplary embodiment of the present invention estimates a delta frequency response based on de-patterning (S710). In connection with the above Equation 27, the de-patterning is performed on X(k) by the following Equation 32.

$$\frac{V(k)}{X(k)} = (H_{ch}(k) - H_{fir}(k))\left[\frac{S(k)}{X(k)}\right] = \Delta H_{fir}(k)\left[\frac{S(k)}{X(k)}\right], \qquad \text{(Equation 32)}$$

$$k = 0, 1, 2, \ldots, F-1$$

In the above Equation 32, the X(k) is an expression of performing the FFT on the x[m] given in the above Equation 1 and $\Delta H_{fir}(k)$ is $H_{ch}(k)-H_{fir}(k)$ and represents the delta frequency response.

If the above Equation 32 is divided by S(k)/X(k), the delta frequency response may be obtained by the following Equation 33.

$$\frac{V(k)}{X(k)}\left(\frac{X(k)}{S(k)}\right) = \Delta H_{fir}(k), k = 0, 1, 2, \ldots, F-1 \qquad \text{(Equation 33)}$$

In the above Equation 33, the V(k) value is a value calculated in the step S610 of FIG. 6, the X(k) is also a value already known, and the S(k) is a value already estimated in FIG. 6. Therefore, the delta frequency response to be estimated may use the value already calculated to be calculated like the above Equation 33.

Meanwhile, in the above Equation 33, the $\Delta H_{fir}(k)$ may be represented by the following Equation 34.

$$\Delta H_{fir}(k) = \sum_{q=0}^{N-1} \Delta a_q e^{-j\frac{2\pi f_s k d_q}{F}} \text{ or} \qquad \text{(Equation 34)}$$

$$\Delta H_{fir}(k) = \sum_{q=0}^{N-1} \Delta a_q e^{-j\frac{2\pi k d_q}{F}}$$

$$\Delta H_{fir}(k) = \sum_{q=0}^{N-1} \Delta a_q e^{-j\frac{2\pi f_s k d_q}{F}}$$

In the above Equation 34, $\Delta a_q$ represents an update attenuation of q-th attenuator and $f_s$ represents a baseband sampling rate.

Next, the estimator 120 according to another exemplary embodiment of the present invention calculates the attenuation Δa to be updated (S720). To calculate the update attenuation Δa of the FIR filter 240 from the delta frequency response expression of the above Equation 34, the above Equation 34 may be represented by a matrix expression by the following Equation 35.

$$\Delta H_{fir} = F\Delta a \qquad \text{(Equation 35)}$$

$$\begin{bmatrix} \Delta H_{fir}(0) \\ \Delta H_{fir}(1) \\ \ldots \\ \Delta H_{fir}(F-1) \end{bmatrix} =$$

$$\begin{bmatrix} 1 & 1 & \ldots & 1 \\ e^{-j\frac{2\pi f_s d_0}{F}} & e^{-j\frac{2\pi f_s d_1}{F}} & \ldots & e^{-j\frac{2\pi f_s d_{N-1}}{F}} \\ \ldots & \ldots & \ldots & \ldots \\ e^{-j\frac{2\pi f_s(F-1)d_0}{F}} & e^{-j\frac{2\pi f_s(F-1)d_1}{F}} & \ldots & e^{-j\frac{2\pi f_s(F-1)d_{N-1}}{F}} \end{bmatrix}$$

$$\begin{bmatrix} \Delta a_0 \\ \Delta a_1 \\ \ldots \\ \Delta a_{N-1} \end{bmatrix}$$

or $$\Delta H_{fir} = F \Delta a$$

$$\begin{bmatrix} \Delta H_{fir}(0) \\ \Delta H_{fir}(1) \\ \ldots \\ \Delta H_{fir}(F-1) \end{bmatrix} =$$

$$\begin{bmatrix} 1 & 1 & \ldots & 1 \\ e^{-j\frac{2\pi d_0}{F}} & e^{-j\frac{2\pi d_1}{F}} & \ldots & e^{-j\frac{2\pi d_{N-1}}{F}} \\ \ldots & \ldots & \ldots & \ldots \\ e^{-j\frac{2\pi(F-1)d_0}{F}} & e^{-j\frac{2\pi(F-1)d_1}{F}} & \ldots & e^{-j\frac{2\pi(F-1)d_{N-1}}{F}} \end{bmatrix}$$

$$\begin{bmatrix} \Delta a_0 \\ \Delta a_1 \\ \ldots \\ \Delta a_{N-1} \end{bmatrix}.$$

In the above Equation 35, $f_s$ is the baseband sampling rate and is a value already known, F is a size of the FFT and is a value already known, and $d_0$-$d_{N-1}$ are fixedly delayed values and are preset values. Therefore, a matrix F may be a value that may be obtained by calculation.

In above Equation 35, if the inverse matrix or the pseudo-inverse matrix is performed on the F, the $\Delta a$ is represented by the following Equation 36.

$$\Delta a = F^\dagger \Delta H_{fir} \quad \text{(Equation 36)}$$

In the above Equation 36, $F^\dagger$ represents an inverse matrix or a pseudo-inverse matrix of the F when N=F and represents the inverse matrix of the F when N<F. $\Delta H_{fir}$ is a vector obtained by the previous estimation in step S710 and F is also a value calculated by the above Equation 35 and is already known, such that the $\Delta a$ is calculated based on the above Equation 36. $\Delta H_{fir}$ Finally, the estimator 120 according to another exemplary embodiment of the present invention uses the $\Delta a$ to tune the attenuation of the FIR filter 240 (S730). By using the $\Delta a$ by the above Equation 36, the estimator 120 determines attenuation a(u+1) to be updated by the following Equation 37.

$$a(u+1) = a(u)\Delta a \quad \text{(Equation 37)}$$

In the above Equation 37, a(u) represents the vector of the current attenuation and corresponds to any initial set value described in the step S610 of FIG. 6. Further, a(u+1) represents the vector of the attenuation to be finally updated.

The FIR filter 240 applies the attenuation a(u+1) to be updated determined by the above Equation 37 to the attenuator of the FIR filter 240. By doing so, the estimator 120 according to another exemplary embodiment of the present invention may minimize the self-interference signal.

Meanwhile, unlike the above Equation 32, the estimator 120 according to another exemplary embodiment of the present invention may perform the de-patterning on the S(k) in the above Equation 27 by the following Equation 38.

$$\frac{V(k)}{S(k)} = (H_{ch}(k) - H_{fir}(k)) = \Delta H_{fir}(k), \quad \text{(Equation 38)}$$

$$k = 0, 1, 2, \ldots, F - 1$$

In the above Equation 38, the V(k) value is a value calculated in the step S610 of FIG. 6 and the S(k) is a value already estimated in FIG. 6. Therefore, the delta frequency response to be estimated may use the value already calculated to be calculated like the above Equation 38.

According to another exemplary embodiment of the present invention as described above, the input signal of the FIR filter 240 including the linear component and the nonlinear component is processed and estimated in the frequency domain and the attenuation of the FIR filter 240 is set using the estimated input signal, thereby obtaining the high SIC gain.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for tuning a finite impulse response (FIR) filter in an in-band full duplex transceiver, the FIR filter receiving a transmission signal to cancel a self-transmitted interference signal, the method comprising:
    setting, by the in-band full duplex transceiver, attenuation of the FIR filter to be a predetermined first value and then estimating input information of the FIR filter;
    estimating, by the in-band full duplex transceiver, a delta response using the input information of the FIR filter;
    updating, by the in-band full duplex transceiver, the attenuation to a second value using the delta response; and
    applying, by the in-band full duplex transceiver, the second value to the FIR filter,
    wherein the estimating of the input information of the FIR filter includes:
    setting, by the in-band full duplex transceiver, the attenuation to be the first value and then generating and transmitting a first training signal, in a first period;
    measuring, by the in-band full duplex transceiver, a first signal that is a baseband equivalent signal for a signal obtained by subtracting an output signal of the FIR filter from the self-transmitted interference signal, in the first period;
    generating and transmitting, by the in-band full duplex transceiver, a second training signal in a second period;
    measuring, by the in-band full duplex transceiver, a second signal that is a baseband equivalent signal for the self-transmitted interference signal, in the second periods; and
    estimating, by the in-band full duplex transceiver, the input information of the FIR filter using the first signal and the second signal.

2. The method of claim 1, wherein the delta response corresponds to a value obtained by subtracting a baseband equivalent time impulse response for the FIR filter set as the first value from a baseband equivalent time impulse response for a radio channel.

3. The method of claim 1, wherein the updating includes:
  calculating, by the in-band full duplex transceiver, a third value that is the attenuation of the FIR filter to be updated by using the delta response; and
  calculating, by the in-band full duplex transceiver, the second value by adding the third value to the first value.

4. The method of claim 1, wherein the estimating of the delta response includes estimating, by the in-band full duplex transceiver, the delta response using the input information of the FIR filter and the first signal.

5. The method of claim 1, wherein the estimating of the input information of the FIR filter includes:
  subtracting, by the in-band full duplex transceiver, the first signal from the second signal to generate a third signal that is a baseband equivalent signal for the output signal of the FIR filter; and
  calculating, by the in-band full duplex transceiver, the input information of the FIR filter using the third signal.

6. The method of claim 1, wherein the measuring of the second signal includes suppressing, by the in-band full duplex transceiver, the output signal of the FIR filter from being generated and then measuring the second signal.

7. The method of claim 1, wherein the first training signal and the second training signal are the same signal.

8. The method of claim 1, wherein the input information of the FIR filter includes a linear component and a nonlinear component.

9. The method of claim 1, wherein the first period and the second period are included in a field for transmitting the first training signal and the second training signal in a time domain frame.

10. An in-band full duplex transceiver comprising:
  a transmitter generating and transmitting a transmitted signal;
  a receiver converting a received signal into a baseband frequency signal and demodulating the converted signal;
  a finite impulse response (FIR) filter receiving the transmitted signal to cancel a self-transmitted interference signal; and
  an estimator estimating input information of the FIR filter by performing fast Fourier transform (FFT) on output information of an analog digital converter included in the receiver and setting attenuation of the FIR filter using the input information of the FIR filter,
  wherein the estimator sets the attenuation to be a first value and then estimates the input information of the FIR filter, estimates a delta frequency response using the input information of the FIR filter, updates the attenuation to a second value using the delta frequency response, and applies the second value to the FIR filter,
  wherein the transmitter generates and transmits a first training signal in a first period and generates and transmits a second training signal in a second period,
  wherein in the first period, the estimator sets the attenuation to be the first value and then performs the FFT on the output information of the analog digital converter to acquire a first signal, and
  wherein in the second period, the estimator performs the FFT on baseband equivalent information for the self-transmitted interference signal to acquire a second signal.

11. The in-band full duplex transceiver of claim 10, wherein the delta frequency response corresponds to a value obtained by subtracting a frequency response for the FIR filter set as the first value from a frequency response for a radio channel.

12. The in-band full duplex transceiver of claim 10, wherein the estimator subtracts the first signal from the second signal to calculate a third signal and uses the third signal to calculate the input information of the FIR filter.

13. The in-band full duplex transceiver of claim 10, wherein the estimator sets the attenuation of the FIR filter in the second period to suppress an output signal of the FIR filter.

14. The in-band full duplex transceiver of claim 10, further comprising:
  an antenna transmitting the transmitted signal to receive the received signal; and
  a distributor transmitting the transmitted signal to the antenna and transmitting the received signal to the receiver.

15. The in-band full duplex transceiver of claim 10, wherein the first training signal and the second training signal are the same signal.

16. A method for tuning a finite impulse response (FIR) filter in an in-band full duplex transceiver, the in-band full duplex transceiver including a transmitter generating and transmitting a transmitted signal, a receiver converting a received signal into a baseband frequency signal, and the FIR filter receiving the transmitted signal to cancel a self-transmitted interference signal, the method comprising:
  setting, by the in-band full duplex transceiver, attenuation of the FIR filter to be a first value and then generating and transmitting a first training signal, in a first period;
  performing, by the in-band full duplex transceiver, FFT on output information of an analog digital converter included in the receiver to acquire a first signal, in the first period;
  generating and transmitting, by the in-band full duplex transceiver, a second training signal in a state in which an output signal of the FIR filter is suppressed, in a second period;
  performing, by the in-band full duplex transceiver, the FFT on the output information of the analog digital converter to acquire a second signal, in the second period;
  estimating, by the in-band full duplex transceiver, input information of the FIR filter using the first signal and the second signal;
  estimating, by the in-band full duplex transceiver, a delta frequency response using the input information of the FIR filter,
  updating, by the in-band full duplex transceiver, the attenuation to a second value using the delta frequency response; and
  applying, by the in-band full duplex transceiver, the second value to the FIR filter.

17. The method of claim 16, wherein the delta frequency response corresponds to a value obtained by subtracting a frequency response for the FIR filter set as the first value from a frequency response for a radio channel.

* * * * *